(12) United States Patent
Dato et al.

(10) Patent No.: US 10,727,848 B2
(45) Date of Patent: Jul. 28, 2020

(54) PHASE-LOCKED LOOP HAVING A MULTI-BAND OSCILLATOR AND METHOD FOR CALIBRATING SAME

(71) Applicant: Analog Devices Global, Hamilton (BM)

(72) Inventors: Pablo Cruz Dato, Valencia (ES); Declan M. Dalton, Ballyneety (IE); Patrick G. Crowley, Mungret (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/794,661

(22) Filed: Jul. 8, 2015

(65) Prior Publication Data

US 2017/0012631 A1    Jan. 12, 2017

(51) Int. Cl.
*H03L 7/093* (2006.01)
*H03L 7/099* (2006.01)
*H03L 7/081* (2006.01)

(52) U.S. Cl.
CPC .......... *H03L 7/0994* (2013.01); *H03L 7/0818* (2013.01); *H03L 7/0992* (2013.01); *H03L 2207/06* (2013.01); *H03L 2207/50* (2013.01)

(58) Field of Classification Search
CPC ....... H03L 7/08; H03L 7/0818; H03L 7/0991; H03L 7/0992; H03L 7/0994; H03L 2207/06; H03L 2207/50
See application file for complete search history.

(56) References Cited

U.S. PATENT DOCUMENTS

| | | | |
|---|---|---|---|
| 5,218,325 | A | 6/1993 | Trelewicz et al. |
| 5,898,336 | A | 4/1999 | Yamaguchi |
| 6,414,555 | B2 | 7/2002 | Staszewski et al. |
| 7,145,399 | B2 | 12/2006 | Staszewski et al. |
| 7,460,499 | B2 | 12/2008 | Elizer et al. |

(Continued)

FOREIGN PATENT DOCUMENTS

| | | |
|---|---|---|
| CN | 103873056 A | 6/2014 |
| CN | 104052474 A | 9/2014 |

(Continued)

OTHER PUBLICATIONS

Wu et al., "A mm-wave FMCW Radar Transmitter Based on a Multirate ADPLL," 2013, IEEE Radio Frequency Integrated Circuits Symposium, pp. 107-110.*

(Continued)

*Primary Examiner* — Timothy A Brainard
*Assistant Examiner* — Daniel P Malley, Sr.
(74) *Attorney, Agent, or Firm* — Knobbe, Martens, Olson & Bear, LLP

(57) ABSTRACT

A phase-locked loop (PLL) comprising a multi-band oscillator and a memory configured to store control input for the oscillator. The PLL is operable in a calibration mode in which the PLL is configured to acquire a frequency controlled word (FCW) for the PLL corresponding to a frequency generated by the oscillator in response to a first control input threshold on a first band of the oscillator; generate a frequency corresponding to said FCW on a second band of the oscillator adjacent to said first band; identify a second control input causing the oscillator to generate said frequency corresponding to said FCW and store said second control input in memory.

26 Claims, 11 Drawing Sheets

(56) References Cited

U.S. PATENT DOCUMENTS

| | | |
|---|---|---|
| 7,668,279 B1 | 2/2010 | You |
| 7,714,669 B2 | 5/2010 | Gotz et al. |
| 7,958,408 B2 | 6/2011 | de Obaldia et al. |
| 8,390,349 B1 | 3/2013 | Ravi et al. |
| 8,536,916 B1* | 9/2013 | van Engelen ........... H03L 7/099 327/150 |
| 9,000,974 B2 | 4/2015 | Vacanti |
| 9,148,153 B2 | 9/2015 | Lu et al. |
| 9,455,854 B2 | 9/2016 | Gao et al. |
| 10,295,580 B2 | 5/2019 | Chillara et al. |
| 2002/0191727 A1 | 12/2002 | Staszewski et al. |
| 2003/0141936 A1 | 7/2003 | Staszewski et al. |
| 2003/0215045 A1 | 11/2003 | Nagata |
| 2004/0148580 A1 | 7/2004 | de Obaldia et al. |
| 2005/0137816 A1 | 6/2005 | Chuang et al. |
| 2006/0002501 A1* | 1/2006 | Muller .................... H03L 7/085 375/371 |
| 2006/0220758 A1* | 10/2006 | Rachedine ............... H03L 7/099 331/185 |
| 2007/0189417 A1 | 8/2007 | Waheed et al. |
| 2008/0197830 A1* | 8/2008 | Mehas .................... H03L 7/085 323/318 |
| 2009/0066425 A1* | 3/2009 | Seo .......................... H03L 7/099 331/34 |
| 2009/0070568 A1 | 3/2009 | Shi et al. |
| 2009/0195440 A1* | 8/2009 | Saunders ................. G01S 7/032 342/175 |
| 2010/0102888 A1* | 4/2010 | Edwards .................... H03L 7/07 331/16 |
| 2010/0134159 A1 | 6/2010 | Jin |
| 2011/0234270 A1 | 9/2011 | Kobayashi |
| 2011/0234327 A1 | 9/2011 | Kobayashi |
| 2012/0013377 A1 | 1/2012 | Zhang et al. |
| 2012/0201338 A1 | 8/2012 | Leung et al. |
| 2013/0106522 A1 | 5/2013 | Kobayashi |
| 2013/0120072 A1 | 5/2013 | Murphy |
| 2013/0301754 A1 | 11/2013 | Staszewski |
| 2014/0072084 A1* | 3/2014 | Zhodzishsky ........... H03L 7/085 375/376 |
| 2014/0085012 A1 | 3/2014 | Wu et al. |
| 2014/0145769 A1 | 5/2014 | Lin |
| 2014/0225635 A1 | 8/2014 | Dasnurkar |
| 2014/0340161 A1* | 11/2014 | Canard ................ H03L 7/0992 331/16 |
| 2015/0180485 A1 | 6/2015 | Shanan |
| 2015/0349992 A1* | 12/2015 | Gao ........................ H04B 1/16 375/376 |
| 2016/0036454 A1* | 2/2016 | Moehlmann .......... H03L 7/0994 327/147 |
| 2016/0344396 A1* | 11/2016 | Moehlmann ............ H03L 7/095 |
| 2016/0344538 A1 | 11/2016 | Moehlmann |

FOREIGN PATENT DOCUMENTS

| | | |
|---|---|---|
| JP | 2008130213 A | 6/2008 |
| JP | 2014095690 A | 5/2014 |

OTHER PUBLICATIONS

Wu, et al., "A mm-Wave FMCW Radar Transmitter Based on a Multirate ADPLL," 2013 IEEE Radio Frequency Integrated Circuits Symposium, Jun. 2013, pp. 107-110.

Wu, Wanghua, "Millimeter-Wave Digitally-Assisted Frequency Synthesizer in CMOS," Doctoral Thesis, Delft University of Technology, 2013.

Temporiti, et al., "A 3 GHz Fractional All-Digital PLL With a 1.8 MHz Bandwidth Implementing Spur Reduction Techniques," IEEE Journal of Solid-State Circuits, vol. 44, No. 3, Mar. 2009, pp. 824-834.

Office Action received in Korean Application No. 10-2016-0079949 dated May 30, 2017; 7 pages and 6 page translation.

Translation of Office Action received in German counterpart Patent Application No. 102016112168.1, dated Oct. 5, 2017 in 6 pages.

Jul. 25, 2018 Office Action from related Chinese Application No. 201610532410.X.

Jan. 5, 2018 Office Action from related Japanese Application No. JP 2016134968.

Aug. 15, 2017 Japanese Office Action for related Japanese App. No. JP 2016-134968 (5 pgs).

* cited by examiner

PHASE-LOCKED LOOP HAVING A MULTI-BAND OSCILLATOR AND METHOD FOR CALIBRATING SAME

TECHNICAL FIELD

The present application relates to an phase-locked loop (PLL) comprising a multi-band oscillator and a memory configured to store control input for the oscillator. It also relates to a frequency calibration method for a PLL comprising a multi-band oscillator.

Embodiments of the present application have particular relevance in the context of a frequency modulated continuous wave (FMCW) radar device comprising a frequency ramp generator for producing a frequency ramp signal and a transceiver for transmitting and receiving said frequency ramp signal.

DESCRIPTION OF THE RELATED TECHNOLOGY

Phase-Locked Loops (PLLs) are a basic building block of integrated circuits used in diverse applications such as wireless communications and radar. In radar applications, for example, a PLL is used to synthesize or generate an output carrier frequency which can be modulated by high frequency ramps.

A long and well known PLL is the Charge-Pump PLL having a voltage controlled oscillator (VCO). However, a number of limitations associated with such a Charge-Pump PLL include the fact that a Charge-Pump PLL typically includes a relatively large external analogue filter, there is an inherent coupling from noisy digital circuits to sensitive analogue nodes such as the VCO tuning voltage and implementations typically have limited headroom for charge pump and VCO tuning ports. Other drawbacks include variation in loop dynamics due to process, voltage, temperature (PVT) variations and the difficulty and hence cost of testing of the Charge-Pump PLL. Furthermore, there is a trend for certain types of integrated circuits to migrate to finer-line CMOS and more digital functionality which a Charge-Pump PLL fails to provide.

A Digital PLL is known in the art which includes a digital-phase detector, a filter and a digitally controlled oscillator and offers a solution to several of the above mentioned drawbacks associated with Charge-Pump PLLs having VCO. Previous digital PLL configurations have achieved relatively wide tuning range and relatively fine frequency resolution. However when used to generate frequency ramps spanning multiple bands of the oscillator, they have required calibration algorithms that have been slow and memory consuming. Therefore, there continues to exist a need for new PLLs, in particular PLLs configured to provide a wideband and highly linear frequency ramp.

SUMMARY OF CERTAIN INVENTIVE ASPECTS

To address these and/or other problems there is provided in accordance with one aspect of the present teaching a phase-locked loop comprising a multi-band oscillator and a memory configured to store control input for the oscillator. The PLL per the present teaching is operable in a calibration mode in which the PLL is configured to acquire a frequency controlled word (FCW) for the PLL corresponding to a frequency generated by the oscillator in response to a first control input threshold on a first band of the oscillator. In the calibration mode, the PLL is further operable to generate a frequency corresponding to said FCW on a second band of the oscillator adjacent to said first band. In the calibration mode, the PLL is further configured to identify a second control input causing the oscillator to generate said frequency corresponding to said FCW and store said second control input in memory.

In one aspect, the PLL of the present teaching further comprises a filter configured to provide said oscillator with a coarse control input and a fine control input in a normal mode of operation of the PLL.

In one aspect, the filter is further configured to connect to an input of the PLL in order to acquire said FCW in said calibration mode of the PLL.

In one aspect, the first control input threshold is a fine control input of said oscillator.

In one aspect, the acquiring, generating, identifying and the storing are performed for each band of the oscillator successively.

In one aspect, prior to said acquiring of the FCW, the PLL is further configured to set the control input to said first control input threshold.

In one aspect, for each band of the oscillator the PLL is further configured to store in said table a further control input generating said FCW on another adjacent band of the oscillator.

In one aspect, the PLL of the present teaching is a digital PLL. In such an aspect the oscillator of the PLL may be a Digitally Controlled Oscillator (DCO) configured to receive a coarse digital control input and a fine digital control input and the first control input threshold is a fine digital control input. In the context of a digital PLL, the filter may be a digital filter.

Such a PLL, which within the context of the present teaching may include a digital PLL, may be particularly advantageously employed in frequency modulated continuous wave (FMCW) radar device comprising a frequency ramp generator for producing a frequency ramp signal and a transceiver for transmitting and receiving said frequency ramp signal.

These and other features will be better understood with reference to the following drawings which provide the person of skill with an understanding of the present teaching but in no way are intended to be limiting.

BRIEF DESCRIPTION OF THE DRAWINGS

The present application will now be described with reference to the accompanying drawings in which.

DETAILED DESCRIPTION OF CERTAIN EMBODIMENTS

Figure 1:
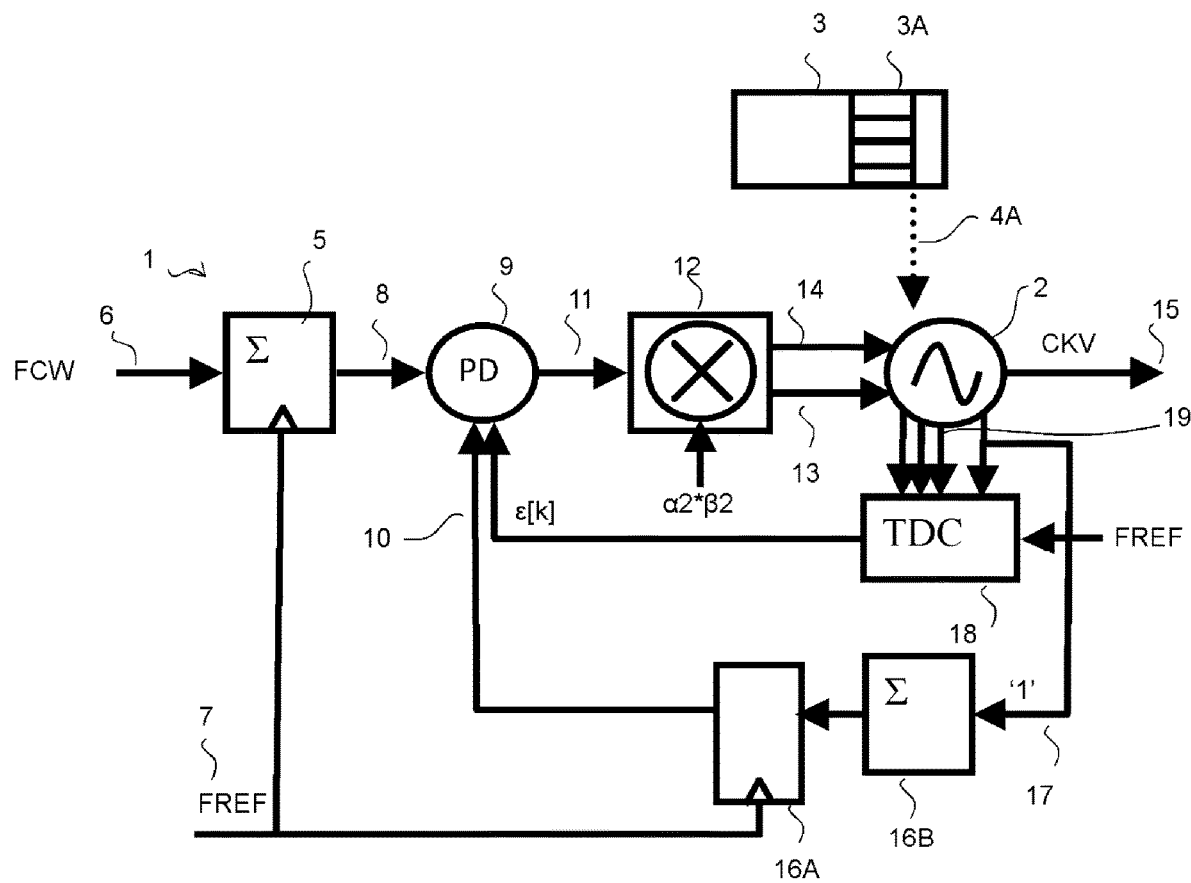
FIG. 1 is a block architecture schematic showing a digital PLL circuit in accordance with an embodiment.

In general, a phase-locked loop provided in accordance with the present teaching comprises a multi-band oscillator and a memory configured to store a control input for the oscillator. Such a PLL is operable in a calibration mode in which the PLL is configured to acquire a frequency controlled word (FCW) for the PLL corresponding to a frequency generated by the oscillator in response to a first control input threshold on a first band of the oscillator and generate a frequency corresponding to said FCW on a second band of the oscillator adjacent to said first band. Such a PLL is further configured in this calibration mode to identify a second control input causing the oscillator to generate said frequency corresponding to said FCW and store said second control input in memory.

Such a PLL may be particularly advantageously employed in frequency modulated continuous wave (FMCW) radar device comprising a frequency ramp generator for producing a frequency ramp signal and a transceiver for transmitting and receiving said frequency ramp signal.

A PLL of the present teaching can overcome the problems of the prior art with frequency calibration which results in the generation of a relatively highly linear frequency ramp.

The frequency differences in the crossing points between adjacent oscillator bands normally cause non-linearity in the generated ramp but are here corrected by adjusting the control input of the multi-band oscillator. To allow for the adjustment of the control input, the frequency value of the oscillator output at the crossing points or points of equivalent frequency between bands in the multi-band oscillator is found and using an PLL in accordance with the present teaching it is possible to efficiently find the oscillator output frequency at adjacent oscillator band crossing points.

Advantageously, a PLL in accordance with the present teaching offers the possibility of calculating and storing the crossing points between bands in the multi-band oscillator in a relatively fast, robust and accurate way. Per the present teaching, it is possible to use the crossing points to improve the linearity in the frequency ramp generation. Accordingly, the linearity in the frequency generation can be improved and the ramp linearity in the band transitions can be as good as inside each band, which is in particular a great advantage for ramp generation in automotive radars.

Specifically, instead of doing a point by point search until control values are found in a calibration mode, a PLL per the present teaching may be configured such that, for a predetermined first control input of the oscillator, the PLL loop locks over the frequency controlled word. Oscillator control inputs generating the same frequency for each pair of adjacent bands are stored in a look-up table. As a result, and in accordance with the present teaching, when a ramp is being generated there is a transition between two adjacent bands and the current oscillator control input is replaced by the equivalent stored value of the next band to linearize the transition. Thus in accordance with the presence teaching, the output of a PLL after calibration can advantageously sweep across the whole oscillator tuning range without significant frequency discontinuities as oscillator bands are crossed.

Advantageously, a PLL provided in accordance with the present teaching has a low complexity calibration circuitry and can include a memory with only a memory storage capability of a single control input per band. In addition, calibration may be fast enough to allow on-the-fly calibration to compensate temperature and voltage variations.

Advantageously, the PLL provided in accordance with the present teaching is a digital PLL. In such a configuration the oscillator may advantageously also be a Digitally Controlled Oscillator (DCO). In this particular case of a digital PLL having a DCO, control inputs for the DCO are digital words that can be directly stored in the memory and the acquisition of FCW for the digital PLL and of digital control inputs for the DCO is simpler. Such a digital PLL can overcome problems associated with prior art implementations by a combination of digital control and frequency calibration, which also results in the generation of a relatively highly linear frequency ramp.

In accordance with the present teaching, there is also provided a frequency calibration method for a phase-locked loop comprising a multi-band oscillator, the method comprising providing a look-up table in a memory of the PLL to store at least one control input for the oscillator; acquiring a frequency controlled word (FCW) for the PLL corresponding to a frequency generated by the oscillator in response to a first control input threshold on a first band of the oscillator; generating a frequency corresponding to said FCW on a second band of the oscillator adjacent to said first band; identifying a second control input causing the oscillator to generate said frequency corresponding to said FCW and storing in said look-up table said second control input.

In one aspect, the frequency calibration method in accordance with the present teaching comprises connecting an input of the PLL with an output of a filter of the PLL in order to acquire said FCW.

In one aspect, the oscillator is configured to receive a coarse control input and a fine control input, the first control input threshold being a fine control input.

In one aspect, the frequency calibration method comprises prior to said acquiring of the FCW, setting the control input to said first control input threshold.

In one aspect, the acquiring, generating, identifying and storing are performed for each band of the oscillator successively.

In one aspect, the frequency calibration method in accordance with the present teaching further comprises for each band of the oscillator storing in said table a further control input generating said FCW on another adjacent band of the oscillator.

A frequency calibration method provided in accordance with the present teaching may advantageously be implemented with a digital PLL having a Digitally Controlled Oscillator.

A PLL or digital PLL can be advantageously employed in the context of a frequency modulated continuous wave (FMCW) radar device comprising a frequency ramp generator for producing a frequency ramp signal and a transceiver for transmitting and receiving said frequency ramp signal. Frequency-modulated continuous-wave (FMCW) radars operating in the millimeter-wave (mm-wave) frequency regime are used in many applications for detecting the speed and position of objects at high-resolution. The radar resolution is directly dependent on the frequency of the transmitted wave and the linearity of the ramp signal. Radar systems with wideband and highly linear frequency ramps can thus provide accurate range information.

As an example, 77 GHz systems with a 1 GHz bandwidth can be used both for long-range detection at distances of several hundreds of meters as well as for short-range, high-resolution radar systems. FMCW radar operating in the GHz range are therefore well adapted for automotive applications where Advanced Driver Assistance Systems (ADAS) are becoming prevalent and may soon be a requirement to achieve the highest safety ratings.

The performance output of a PLL with a VCO used to generate the radar signal is typically non-linear. Therefore, special effort should be taken to insure that the control voltage for the VCO produces the desired linear modulation ramp output slope. A PLL or digital PLL having a multiband oscillator per the present teaching has particular advantageous application in such a context.

In accordance with the present teaching, there is also provided a frequency modulated continuous wave (FMCW) radar device comprising a frequency ramp generator for producing a frequency ramp signal, and a transceiver for transmitting and receiving said frequency ramp signal, the frequency ramp generator having a PLL comprising a multiband controlled oscillator and a memory configured to store control input for the oscillator, wherein the PLL is operable in a calibration mode in which the PLL is configured to: acquire a frequency controlled word, FCW, for the PLL corresponding to a frequency generated by the oscillator in response to a first control input threshold on a first band of the oscillator; generate a frequency corresponding to said FCW on a second band of the oscillator adjacent to said first band; and identify a second control input causing the oscillator to generate said frequency corresponding to said FCW and store said second control input in memory.

The PLL may further comprise a filter configured to provide said oscillator with a coarse control input and a fine control input in a normal operation of the PLL.

In one aspect, the filter is further configured to connect to an input of the PLL in order to acquire said FCW in said calibration mode of the PLL.

In one aspect, the first control input threshold is a fine control input of said oscillator.

In one aspect, the acquiring, generating, identifying and the storing are performed for each band of the oscillator successively.

In one aspect, prior to said acquiring of the FCW, the PLL is further configured to set a control input of the oscillator to said first control input threshold.

In yet another aspect, for each band of the oscillator the PLL is further configured to store in said table a further control input generating said FCW on another adjacent band of the oscillator.

Advantageously, in another aspect, the PLL is a digital PLL and the oscillator is a Digitally Controlled Oscillator (DCO) configured to receive a coarse digital control input and a fine digital control input, the first digital control input threshold being a fine digital control input.

Accordingly the present teaching also extends to providing a vehicle comprising a frequency modulated continuous wave (FMCW) radar device comprising a frequency ramp generator for producing a frequency ramp signal, a transceiver for transmitting and receiving said frequency ramp signal, and a PLL or a digital PLL as previously described.

It will be understood that digital PLLs may generally have various circuit architectures that allow to perform the method of the present teaching and two examples of digital PLLs are described in E. Temporiti, C. Wu, D. Baldi, R. Tonietto, and F. Svelto, "A 3 GHz fractional all-digital PLL with a 1.8 MHz bandwidth implementing spur reduction techniques," IEEE JSSC, Mar. 2009.

FIG. 1 illustrates a block architecture schematic of an exemplary digital PLL 1 circuit according to the present teaching which overcomes many ramp non-linearity effects that are traditionally encountered.

As shown on FIG. 1, the digital PLL 1 circuit generally comprises a multi-band digitally controlled oscillator (DCO) 2 and a memory 3 configured to store a digital control input 4A for the DCO.

A multi-band oscillator generally comprises at least one input which determines a frequency band of an output signal produced by the oscillator. The multi-band oscillator is generally configured to generate an output signal with a frequency that is adjustable within frequency ranges in response to respective parameter values of an operating parameter. The output signal frequency is generally generated within each frequency range in response to an input control signal within a predetermined control range. An example of a multi-band digitally controlled oscillator is described in W. Wu, X. Bai, R. B. Staszewski and J. R. Long "A mm-wave FMCW radar transmitter based on a multirate ADPLL", Proc. IEEE Radio Frequency Integr. Circuits Symp., pp. 107-110 2013.

More precisely, as seen on FIG. 1, the digital PLL 1 circuit further comprises a phase accumulator 5 configured to accumulate a frequency command word FCW at an input 6 of the digital PLL 1 circuit with every rising edge of a reference frequency clock CKR 7. In this way, it is possible to generate a reference phase signal 8. A phase frequency detector (PD) 9 for detecting frequency difference and phase difference between the reference phase signal 8 and a feedback signal 10 may be provided to thereby generate a digital phase error signal 11. The circuit may further comprise a digital filter loop 12 for generating digital control input 13, 14 to the DCO 2 according to the digital phase error signal 11. The DCO 2 is coupled to the digital filter 12 and is configured to generate a DCO output signal 15 in response to the digital control input 4A, 13, 14. Advantageously, the DCO 2 may be a multi-band on-chip DCO, for example, a digital rotary travelling-wave oscillator (RTWO).

The digital PLL 1 circuit may further comprise a phase accumulator comprising an accumulator 16B and latch 16A for generating the feedback signal 10 by counting the number of rising edges of an output signal 17 from the DCO 2; and a Time-to-Digital Converter (TDC) 18 configured to determine from DCO output signals 19 a fractional correction signal $\epsilon[k]$ which is subtracted with the feedback signal 10 from the reference phase signal 8.

More particularly according to present teaching, in a normal operation of the digital PLL 1, the digital phase error signal 11 is digitally filtered by the digital loop filter 12 to create a coarse digital control input 13 and a fine digital control input 14 that enable tuning of the DCO 2 to a desired frequency, as will be described in more detail hereafter.

Figure 2:
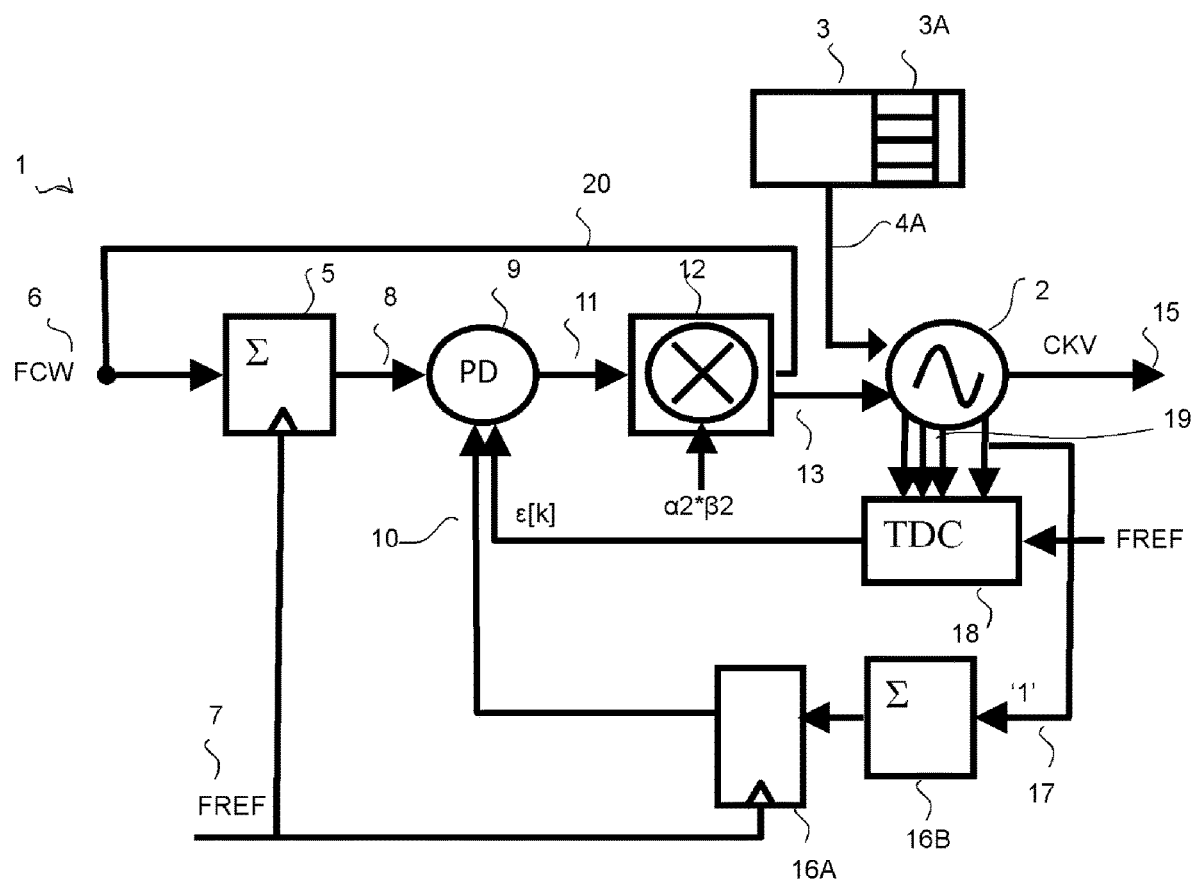
FIG. 2 is a block architecture schematic showing the digital PLL circuit of FIG. 1 in a calibration mode in accordance with an embodiment.

FIG. 2 illustrates a digital PLL 1 according to the present teaching during a calibration mode in which the input 6 of the digital PLL is switched to connect to the fine output 14 of digital filter 12 via a loop 20 to replace the FCW provided during normal mode of operation.

A calibration algorithm of the digital PLL 1 according to the present teaching will now be described in more detail with reference to FIGS. 3 and 4.

To allow the adjustment of the digital control input, the calibration algorithm of the digital PLL 1 is configured to first find the DCO output frequency value at the crossing points. For a first value n of the coarse digital control input 13, i.e., a first band n of the DCO 2 as illustrated for example in FIG. 4, the DCO fine digital control input 14 is first set at operation 30 to an upper predetermined first digital control input threshold. The digital PLL 1 is then re-configured at operation 31 by connecting the digital filter 12 to the digital PLL input 6 via the loop 20, as shown in FIG. 2, so as to acquire at operation 32 a FCWn that locks the digital PLL loop with the upper predetermined first digital control input threshold for that DCO band n. In other words, the acquired FCWn corresponds to a frequency generated by the DCO 2 in response to the upper predetermined digital control input threshold on the band n of the DCO 2.

After the FCWn is acquired for the first band n of the DCO 2, the digital PLL 1 is set back at operation 33 to its normal configuration, as shown in FIG. 1, that is without the digital filter 12 connecting to the digital PLL input 6. The DCO band is then incremented at operation 34 to an upper second band n+1 by adjusting the value of the coarse digital control input 13, and the frequency input FCW to the digital PLL 1 is fixed at operation 35 to the previously acquired value FCWn to allow the digital PLL 1 to lock to the corresponding fine digital control input 14 of the DCO 2 Fine n+1. The digital control input Fine n+1 is then stored at operation 36 in a look-up table 3A of the memory 3 of the digital PLL 1 in association with the corresponding DCO band. The acquiring of the FCWn and the storing of the fine digital control input Fine n+1 are then successively performed for each band of the DCO 2, thereby covering the full frequency range of the digital PLL 1.

Figure 4:
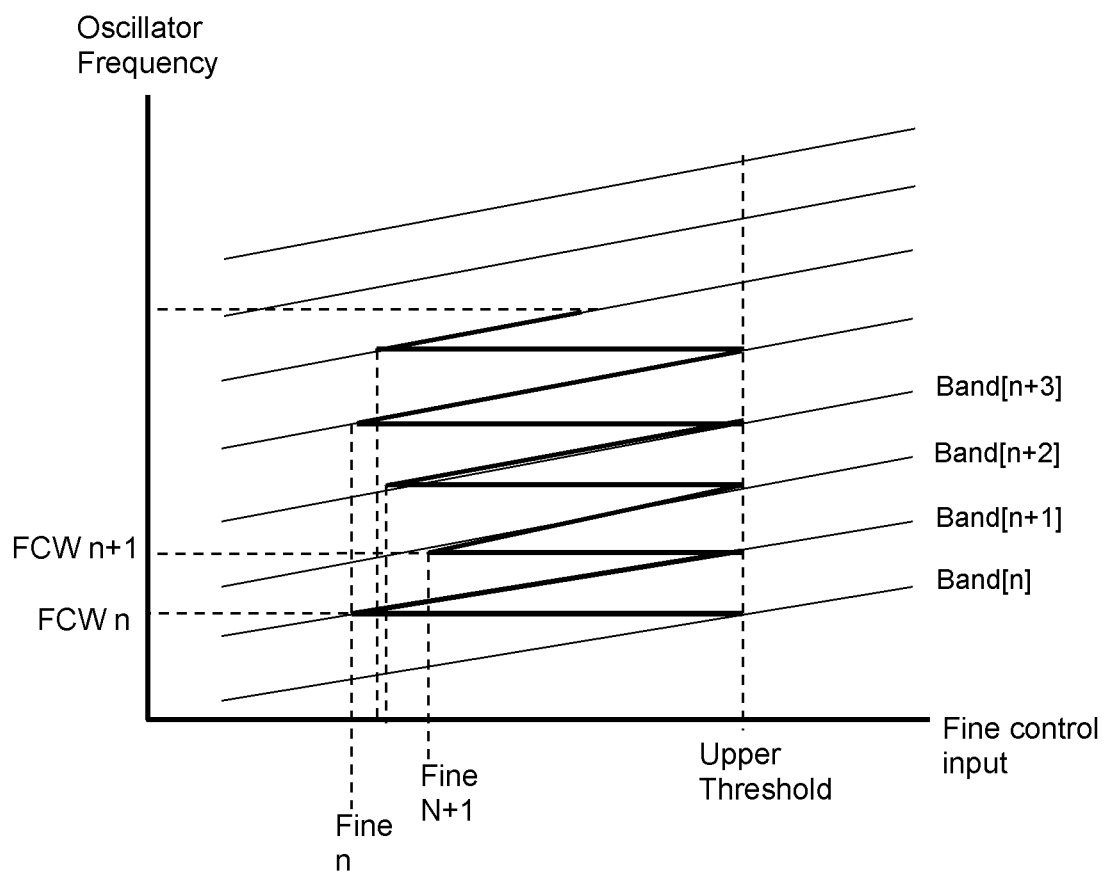
FIG. 4 shows a plot of a multiband oscillator output frequency as a function of the oscillator fine control input in a PLL circuit in accordance with an embodiment.

Therefore, as better seen on FIG. 4, the upper first digital control input threshold in band n can generate the same frequency as the digital control input Fine n+1 in the adjacent band n+1. In other words, the digital control input Fine n+1 causes the DCO 2 to generate a frequency corresponding to the FCWn on the band n+1 of the DCO adjacent to the band n. The FCWn corresponds to the frequency of the crossing point between the two adjacent DCO bands n and n+1.

Advantageously, since the first digital control input threshold is a single fixed programmable value, only one fine digital control input Fine n+1 per respective band of the DCO 2 is stored, reducing the amount of memory to perform the calibration of the digital PLL 1 of the present teaching.

In a normal operation mode of the digital PLL 1 of the present teaching, the fine digital control input Fine n+1 acquired during the calibration mode is used to adjust the fine digital control input 14 of the DCO 2 at the band transitions, therefore generating a linear ramp, that is a signal whose frequency increases or decreases linearly with time.

In normal operation of the digital PLL 1 generating a ramp signal, for a value of the coarse digital control input 13 corresponding to a DCO band n, if the current fine digital control input 14 is higher than the first digital control input threshold, the current fine digital control input 14 is decreased by the difference between the first digital control input threshold and the memory stored fine digital control input Fine n+1 and the coarse digital control input 13 is increased by 1 to n+1 corresponding to the upper adjacent DCO band n+1. Thus, as the first digital control input threshold in band n generates the same frequency as the digital control input Fine n+1 in the adjacent band n+1, the continuity in the frequency of the ramp is ensured when changing band of the DCO.

On the other hand, for the value n+1 of the coarse digital control input 13 corresponding to the DCO band n+1, if the current fine digital control input 14 is lower than the fine digital control input Fine n+1 stored in the memory 3, the current fine digital control input 14 will be increased by the difference between the first digital control input threshold and the memory stored fine digital control input Fine n+1 and the coarse digital control input 13 decreased by 1 to n corresponding to the lower adjacent DCO band n. As before, the continuity in the frequency of the ramp can be ensured when changing band of the DCO.

It will be appreciated that in implementations whereby only a fine digital control input Fine n+1 is stored for each DCO band, some range for frequency generation is lost as the fine digital control input 14 will typically not go beyond the first digital control input threshold. This range can be increased using the same principle by calculating and storing fine digital control input for both upper and lower bands, thereby doubling both the memory consumption and the calibration time. For that purpose, the process of acquiring the FCWn and storing the fine digital control input can be repeated by, on each band, setting a lower digital control input threshold as oppose to the upper digital control input threshold as explained here above, and changing to the lower band to subsequently acquire the fine digital control input that generates the same frequency in this lower band.

Figure 5:
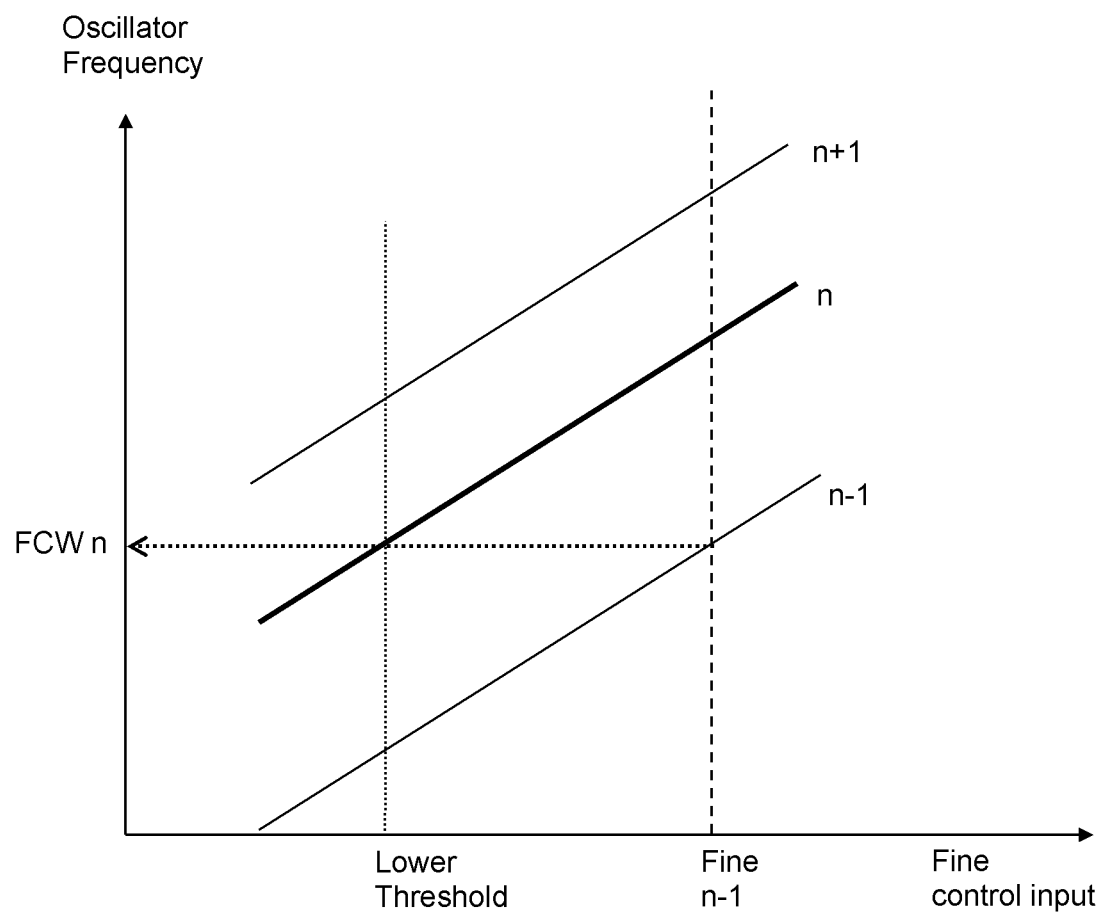
FIG. 5 shows a plot of a multiband oscillator output frequency as a function of the oscillator fine control input in a PLL circuit in accordance with an aspect of the present teaching.

More specifically, for each band n of the DCO 2, the DCO fine digital control input 14 is thus set at operation 30 to a lower predetermined first digital control input threshold, as illustrated on FIG. 5. The digital PLL 1 is then re-configured at operation 31 by connecting the digital filter 12 to the digital PLL input 6 via the loop 20 so as to acquire at operation 32 a FCWn that locks the digital PLL loop with the lower predetermined first digital control input threshold for that DCO band n. Thereafter, the digital PLL 1 is set back to its normal configuration at operation 33 and the DCO band is then decremented at operation 34 to a lower second band n−1 by adjusting the value of the coarse digital control input 13, and the frequency input FCW to the digital PLL 1 is fixed at operation 35 to the previously acquired value FCWn to allow the digital PLL 1 to lock to the corresponding fine digital control input 14 of the DCO 2 Fine n−1. The digital control input Fine n−1 is then stored at operation 36 in the look-up table 3A of the memory 3 of the digital PLL 1. The acquiring of the FCWn and the storing of the fine digital control input Fine n−1 are then successively performed for each band of the DCO 2, thereby covering the full frequency range of the digital PLL 1. Therefore, as shown in FIG. 5, the lower first digital control input threshold in band n generates the same frequency as the digital control input Fine n−1 in the adjacent band n−1, in a corresponding way as explained above with regard to the upper first digital control input threshold. The digital control input Fine n−1 causes the DCO 2 to generate a frequency corresponding to the FCWn on the band n−1 of the DCO adjacent to the band n. The FCWn corresponds to the frequency of the crossing point between the two adjacent DCO bands n and n−1.

In another calibration mode of the digital PLL 1 of the present teaching, a calibration over PVT bands may be provided. Calibration over PVT bands is similar to the coarse band calibration previously described. For the PVT calibration a first coarse band threshold is set and a fine control is hold constant while a FCWn is acquired in the previously described re-configured digital PLL calibration mode. Then the digital PLL 1 is set back to its normal operation mode and the PVT band is incremented or decremented. The FCW is set to FCWn so as to acquire a second coarse band value which is stored. In this case, the first coarse band value in the first PVT band generates the same frequency as the second coarse value in the second PVT band.

Figure 6:
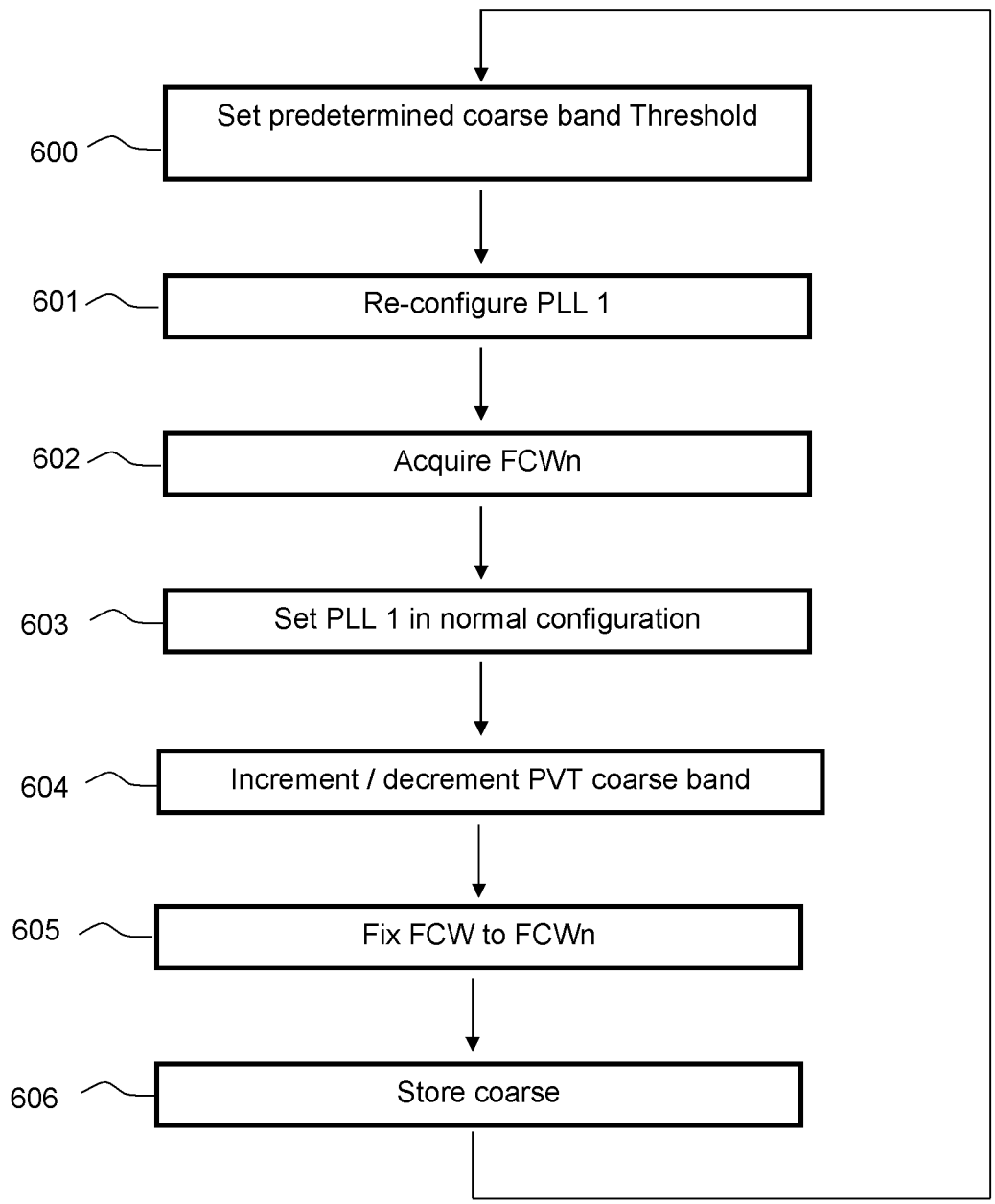
FIG. 6 shows a diagram of another calibration method in accordance with an embodiment.

FIG. 6 illustrates a calibration method over PVT bands of a PLL per the present teaching. The PVT calibration will be described with reference to the digital PLL 1 previously described, it will however be appreciated that the PVT calibration method similarly applies to other PLLs per the present teaching. For each PVT band m of the DCO 2, the DCO coarse digital control input 14 is set at operation 600 to a predetermined first digital control input threshold. The digital PLL 1 is then re-configured at operation 601 by connecting the digital filter 12 to the digital PLL input 6 via the loop 20 so as to acquire at operation 602 a FCWm that locks the digital PLL loop with the predetermined first digital control input threshold for that PVT band m of the DCO 2. Thereafter, the digital PLL 1 is set back to its normal configuration at operation 603 and the PVT band of the DCO 2 is then decremented at operation 604 to a lower second band m−1. It will be appreciated that the PVT band of the DCO 2 may also be incremented at operation 604 to an upper second band m+1 at this stage. The frequency input FCW to the digital PLL 1 is fixed at operation 605 to the previously acquired value FCWm to allow the digital PLL 1 to lock to the corresponding coarse digital control input of the DCO 2 which is then stored at operation 606 in the look-up table 3A of the memory 3 of the digital PLL 1. The acquiring of the FCWm and the storing of the coarse digital control input are then successively performed for each PVT band m of the DCO 2, thereby covering the full PVT range of the digital PLL 1 in a corresponding way as explained above with regard to the upper and lower first digital control input threshold. During this PVT calibration, the fine control input is set to a constant value.

Figure 7:
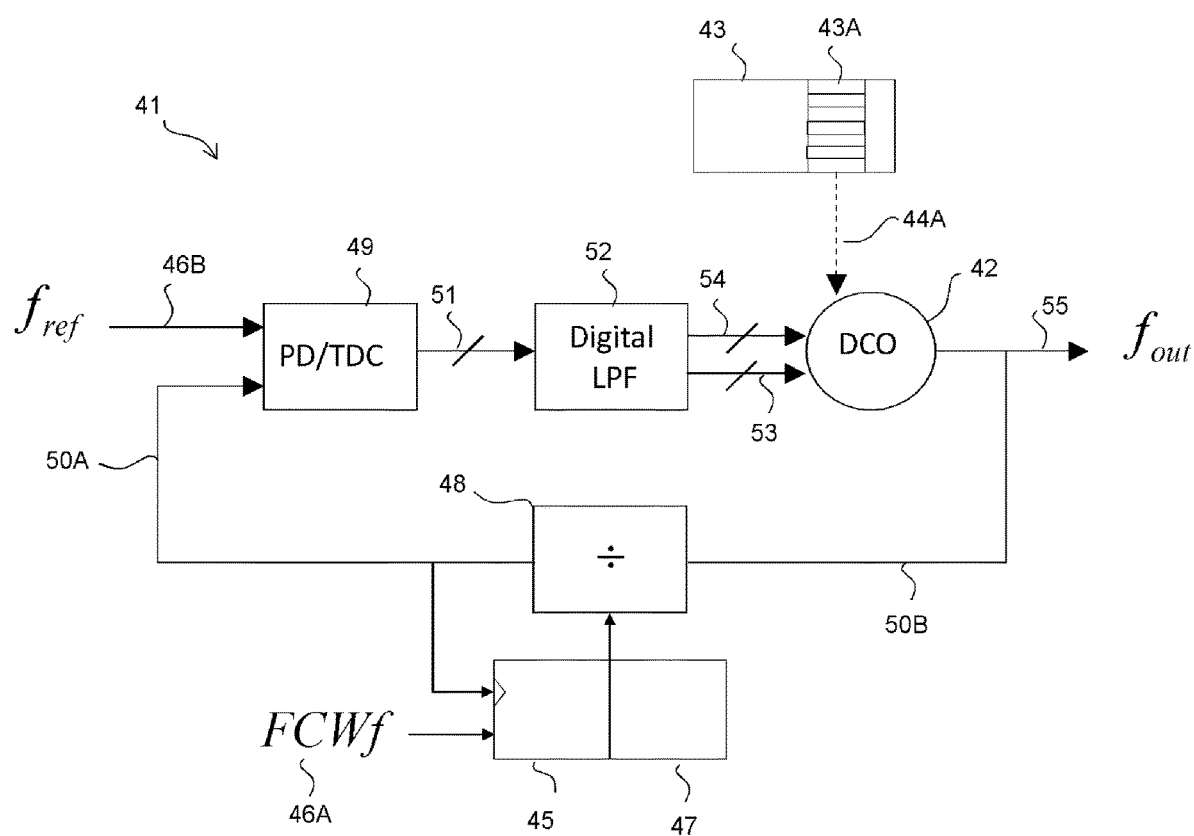
FIG. 7 is a block architecture schematic showing a digital PLL circuit in accordance with another embodiment.

FIG. 7 illustrates a block architecture schematic of another exemplary digital PLL 41 circuit according to the present teaching which also overcomes many ramp non-linearity effects that are traditionally encountered.

As shown on FIG. 7, the digital PLL 41 circuit generally comprises a multi-band digitally controlled oscillator (DCO) 42 and a memory 43 configured to store a digital control input 44A for the DCO.

As seen on FIG. 7, the digital PLL 41 circuit further comprises a phase accumulator 45 configured to accumulate a frequency command word FCWf at an input 46A of the digital PLL 41 circuit previously processed in a Sigma-Delta Modulator 47 and provide an accumulated signal to a frequency divider 48. The frequency divider 48 may further generate a phase signal 50A for a phase frequency detector (PD/TDC) 49 by dividing an output signal 50B from the DCO 42.

The phase frequency detector 49 is configured to detect frequency difference and phase difference between the reference phase signal 50A and an input analog frequency reference $f_{ref}$ 46B to thereby generate a digital phase error signal 51. The circuit may further comprise a digital low pass filter (LPF) 52 for generating digital fine and coarse control input 53, 54 to the DCO 42 according to the digital phase error signal 51. The DCO 42 is coupled to the filter 52 and is configured to generate a DCO output signal 55 of frequency $f_{out}$ in response to the control input 53, 54.

In a normal operation of the digital PLL 41 of the present teaching, the digital phase error signal 51 is digitally filtered by the digital loop filter 52 to create a coarse digital control input 53 and a fine digital control input 54 that enable tuning of the DCO 42 to a desired frequency, in a similar way as described earlier with respect to the digital PLL 1 of FIG. 1.

Figure 8:
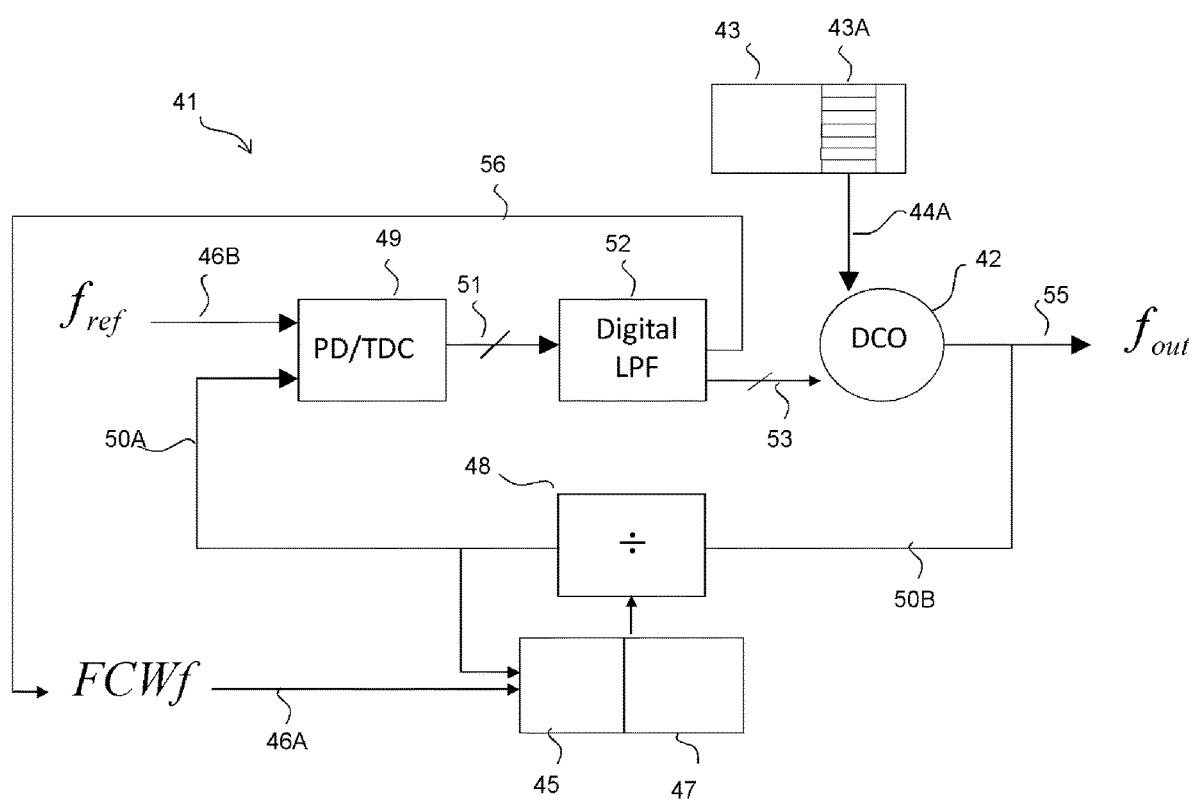
FIG. 8 is a block architecture schematic showing a digital PLL circuit of FIG. 7 in a calibration mode.

FIG. 8 illustrates the digital PLL 41 of FIG. 7 according to the present teaching during a calibration mode in which the input 46A of the digital PLL 41 is switched to connect to the fine output 54 of digital filter 52 via a loop 56 to replace the FCWf provided during normal mode of operation.

Figure 3:
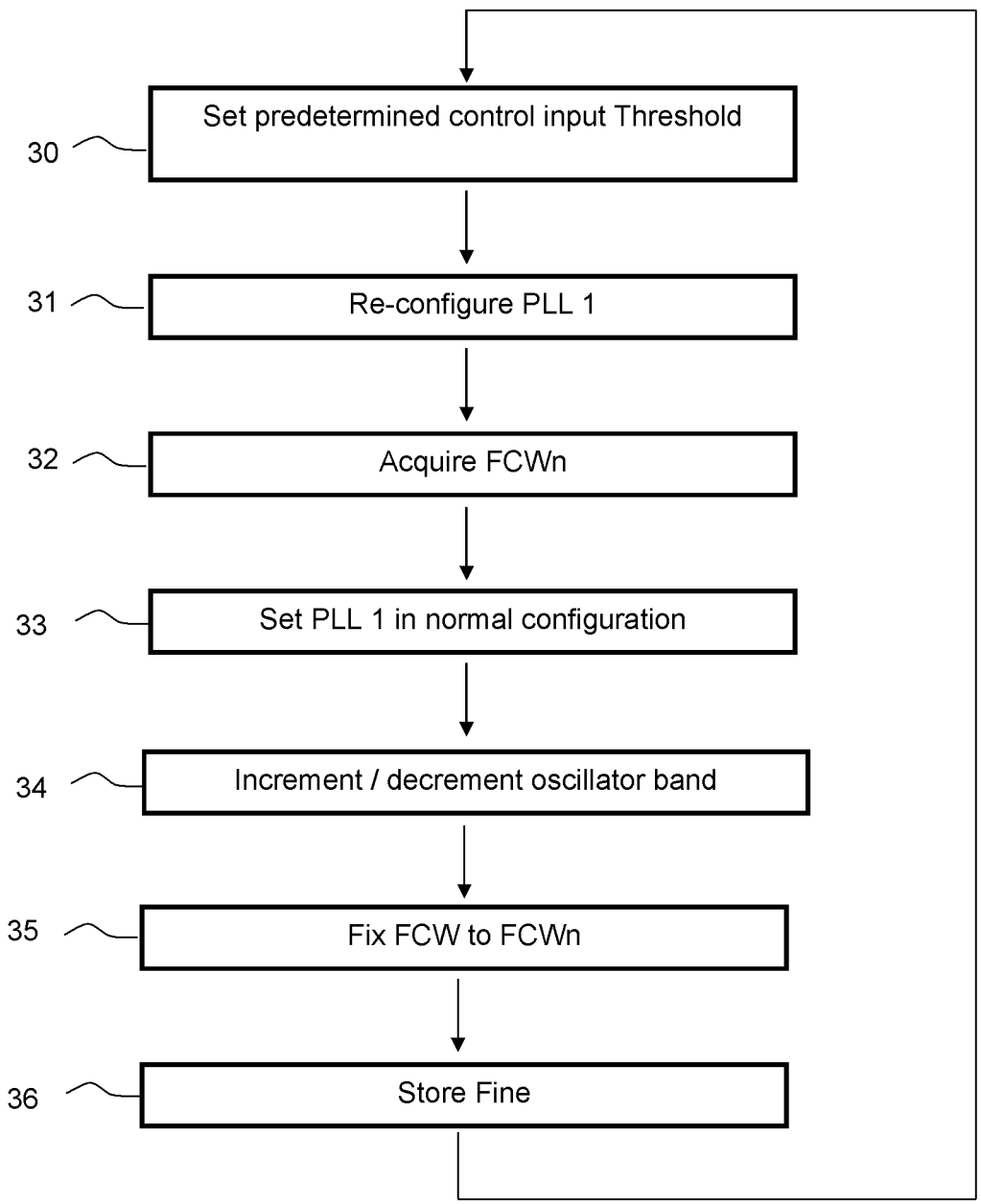
FIG. 3 shows a diagram of the calibration method in accordance with an embodiment.

As it will be understood by a skilled person, the calibration algorithm of the digital PLL 41 according to the present teaching may be carried out in a similar way as the calibration algorithm of the digital PLL 1 described here above with reference to FIGS. 3 and 4. It will be appreciated that the operation mode of the digital PLL 41 per the present teaching is similar to the operation mode of the digital PLL 1 per the present teaching and the skilled person will recognize similar advantages.

In the calibration algorithm of the digital PLL 41, for a first value n of the coarse digital control input 53 of the DCO 42, the DCO fine digital control input 54 is first set to an upper predetermined first digital control input threshold. The digital PLL 41 is then re-configured by connecting the digital filter 52 to the digital PLL input 46A via the loop 56, as shown in FIG. 8, so as to acquire a FCW that locks the digital PLL loop with the upper predetermined first digital control input threshold for that DCO band n.

After the FCW is acquired for the first band n of the DCO 42, the digital PLL 41 is set back to its normal configuration, as shown in FIG. 7, that is without the digital filter 52 connecting to the digital PLL input 46A. The DCO band is then incremented to an upper second band n+1 by adjusting the value of the coarse digital control input 53, and the frequency input FCW to the digital PLL 41 is fixed to the previously acquired value FCW to allow the digital PLL 41 to lock to the corresponding fine digital control input 54 of the DCO 42 Fine n+1. The digital control input Fine n+1 is then stored in a look-up table 43A of the memory 43 of the digital PLL 41 in association with the corresponding DCO band. The acquiring of the FCW and the storing of the fine digital control input Fine n+1 are then successively performed for each band of the DCO 42, thereby covering the full frequency range of the digital PLL 41.

In a normal operation mode of the digital PLL 41 of the present teaching, the fine digital control input Fine n+1 acquired during the calibration mode is used to adjust the fine digital control input 54 of the DCO 42 at the band transitions, therefore generating a linear frequency ramp.

Figure 9:
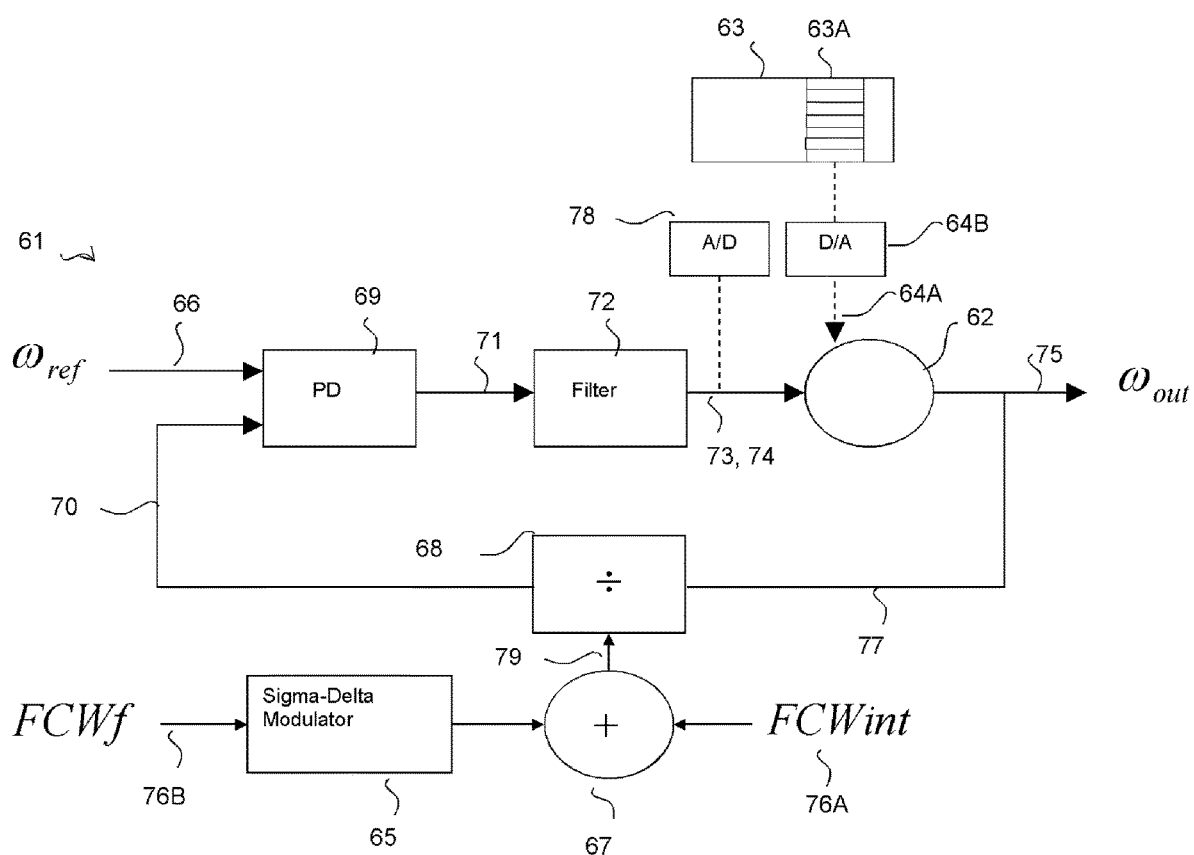
FIG. 9 a block architecture schematic showing a PLL circuit in accordance with still another embodiment.

FIG. 9 illustrates a block architecture schematic of an exemplary charge-pump PLL 61 circuit according to the present teaching which also overcomes many ramp non-linearity effects that are traditionally encountered.

As shown on FIG. 9, the PLL 61 circuit generally comprises a multi-band voltage controlled oscillator 62 and a memory 63 configured to store a control input 64A for the oscillator 62. A digital to analog converter element 64B is inserted between the memory 63 and the oscillator 62 to convert a digital control input stored in the memory 63 and provide the oscillator 62 an appropriate analog control input.

As previously stated in the case of the multi-band DCO, a multi-band oscillator comprises at least one input which determines a frequency band of an output signal produced by the oscillator.

More precisely, as illustrated on FIG. 9, the PLL 61 circuit further comprises a phase accumulator 67 configured to accumulate a frequency command word FCW having an integer part FCWint 76A and a fractional part FCWf 76B at an input of the PLL 61 circuit, the fractional part FCWf 76B being previously processed in a Sigma-Delta Modulator 65 and provide an accumulated signal 79 to a frequency divider 68. The frequency divider 68 may further generate a reference phase signal 70 by dividing an output signal 77 from the oscillator 62.

A phase frequency detector (PD) 69 for detecting frequency difference and phase difference between the reference phase signal 70 and an input frequency reference $\omega_{ref}$ 66 may be provided to thereby generate a phase error signal 71. The circuit may further comprise a filter loop 72 for generating control input 73, 74 to the oscillator 62 according to the phase error signal 71. The oscillator 62 may be coupled to the filter 72 and is configured to generate an oscillator output signal 75 of frequency $\omega_{out}$ in response to the control input 64A, 73, 74.

According to present teaching, in a normal operation of the PLL 61, the phase error signal 71 is filtered by the loop filter 72 to create a coarse control input 73, as a digital word for the oscillator 62, and a fine control input 74, as an analog voltage input for the oscillator 62, that enable tuning of the oscillator 62 to a desired frequency, as will be described in more details hereafter.

Figure 10:
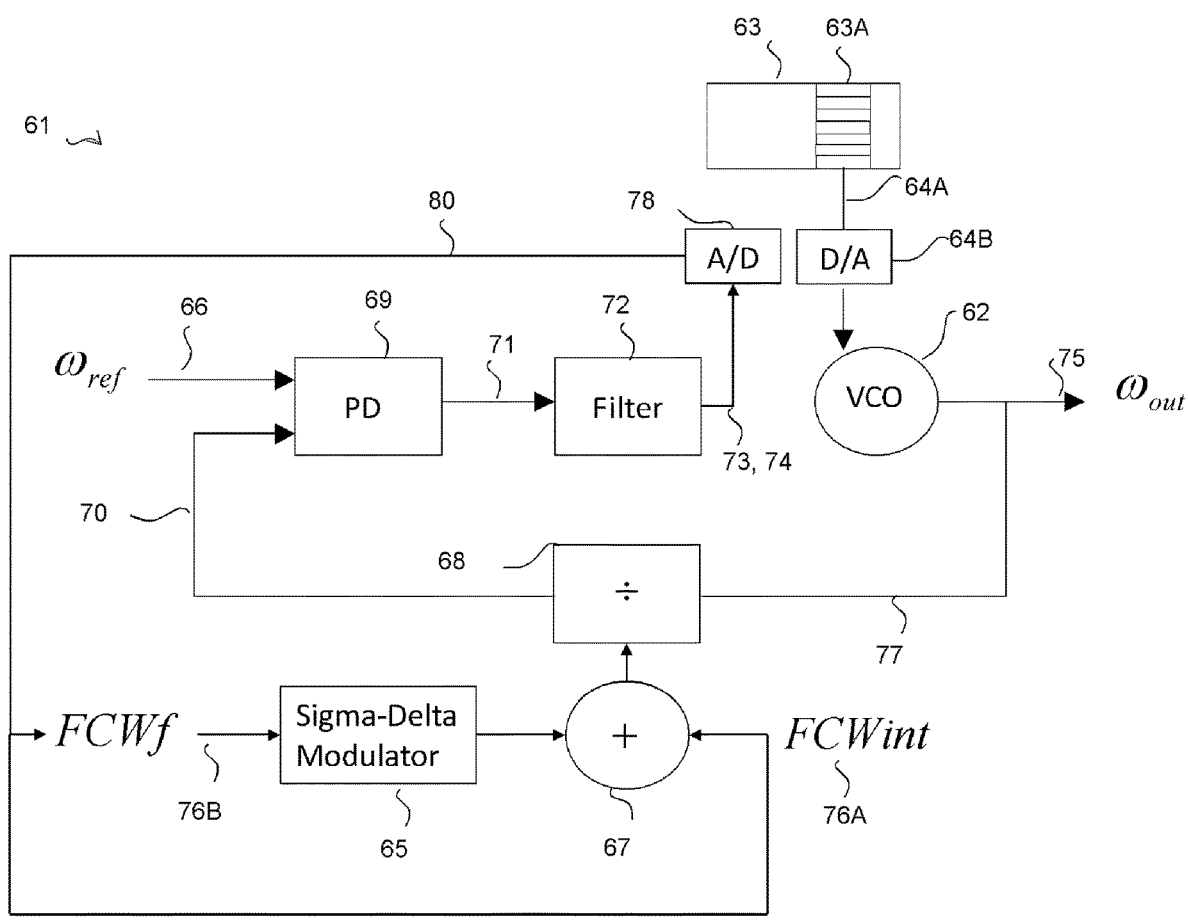
FIG. 10 is a block architecture schematic showing a PLL circuit of FIG. 9 in a calibration mode.

FIG. 10 illustrates the PLL 61 according to the present teaching during a calibration mode in which the input of the PLL 61 is switched to connect to the fine output 74 of filter 72 via a loop 80 to replace the FCW (FCWint as well as FCWf) provided during normal mode of operation. Advantageously an analog to digital converter element 78 may be inserted to convert the analog voltage fine output 74 into a digital signal entering the phase accumulator 67.

The calibration algorithm of the PLL 61 according to the present teaching is similar to the calibration algorithm of the digital PLL 1 circuit previously described with reference to FIGS. 3 and 4 and will be easily implemented by a skilled person.

Shortly, the calibration algorithm of the PLL 61 is configured to first find the oscillator output frequency value at the crossing points. For a first value n of the coarse control input 73, the oscillator fine control input 74 is first set at operation 30 to an upper predetermined first control input threshold. The PLL 61 is then re-configured at operation 31 by connecting the filter 72 to the PLL input 76A,76B via the analog to digital converter element 78 and the loop 80, as shown in FIG. 10, so as to acquire at operation 32 a FCWn that locks the PLL loop with the predetermined first control input threshold for that oscillator band n.

After the FCWn is acquired for the first band n of the oscillator 62, the PLL 61 is set back at operation 33 to its normal configuration, as shown in FIG. 9, that is without the filter 72 connecting to the PLL input 76A,76B. The oscillator band is then incremented at operation 34 to an upper second band n+1 by adjusting the value of the coarse control input 73, and the frequency input FCW to the PLL 61 is fixed at operation 35 to the previously acquired value FCWn to allow the PLL 61 to lock to the corresponding fine control input 74 of the oscillator 62 Fine n+1. The control input Fine n+1 is then stored at operation 36 in a look-up table 63A of the memory 63 of the PLL 61. The acquiring of the FCWn and the storing of the fine control input Fine n+1 are then successively performed for each band of the oscillator 62, thereby covering the full frequency range of the PLL 61.

Advantageously, in a similar way as the calibration of the digital PLL previously described, only one fine control input Fine n+1 per respective band of the oscillator 62 is stored thereby reducing the amount of memory to perform the calibration of the PLL 61 of the present teaching.

In a normal operation mode of the PLL 61 of the present teaching, the fine control input Fine n+1 acquired during the calibration mode is used to adjust the fine control input 74 of the oscillator 62 at the band transitions, therefore generating a linear ramp.

It will be appreciated that the operation mode of the PLL 61 per the present teaching is similar to the operation mode of the digital PLL 1 per the present teaching and the skilled person will recognize similar advantages.

Generally PLLs can operate in two modes depending on the loop filter type. A PLL in a Type I mode does not have an integrator on the loop filter, allowing a faster response in frequency but increasing the noise at the output frequency. On the other hand, a PLL in a Type II mode allows a better signal but is slower tracking changes and locking to the target frequency. In one aspect, the PLL acquisition of the FCW described above is done with the digital PLLs 1, 41 or PLL 61 in a Type I mode to fast and accurately find the FCW.

It will be appreciated that a digital PLL or PLL provided in accordance with the present teaching can provide a number of advantages. By adjusting the frequency discontinuities at oscillator band transitions using the calibration algorithm and digital control input stored in the PLL memory, a highly linear ramp can be generated by the PLL.

As the calibration algorithm of the present teaching is applied on the coarse oscillator bands, and if the PVT per bank is substantially fixed, the calibration algorithm can be implemented with only a memory storage capability of a single digital control input per band.

In addition, the calibration of the present PLL can be fast enough to allow on-the-fly calibration to compensate temperature and voltage variations.

For example in an implementation of the digital PLL 1 according to the present teaching, the calibration data were stored in a look-up table with 16 bits of memory per DCO band, or 256 bits in total for 16 bands, and the time for the calibration was 5 microseconds per bank, or 640 microseconds in total.

Figure 11:
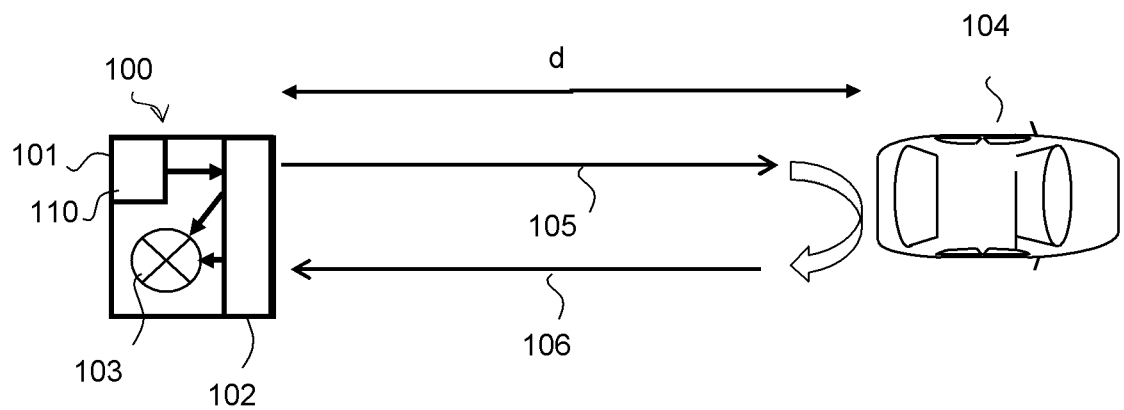
FIG. 11 is a schematic showing a FMCW radar device in accordance with an embodiment.

FIG. 11 illustrates schematically a FMCW radar system 100 incorporating an digital PLL 110 according to the present application. The digital PLL 110 can be implemented in accordance with any of the principles and advantages of digital PLLs discussed herein. It will be understood that the FMCW radar system 100 could alternatively incorporate a PLL having a multi-band oscillator per the present teaching and achieve similar goals.

The radar system 100 comprises a frequency ramp generator 101 for producing a frequency ramp signal and comprising the digital PLL 110. The frequency ramp generator 101 is connected to a transceiver 102 for transmitting and receiving said frequency ramp signal. The radar system 100 also comprises a comparator 103 for comparing signals transmitted and received by the received 102. The transmitted signal 105 is reflected back by an object 104 and returns to the transceiver 102 as a reflected signal 106 and both signals 105, 106 are used to determine the distance d between the object 104 and the radar system 100.

In a particular embodiment the FMCW radar system 100 of the present teaching may be included in a vehicle, for example as part of an Advanced Driver Assistance System.

Figure 12:
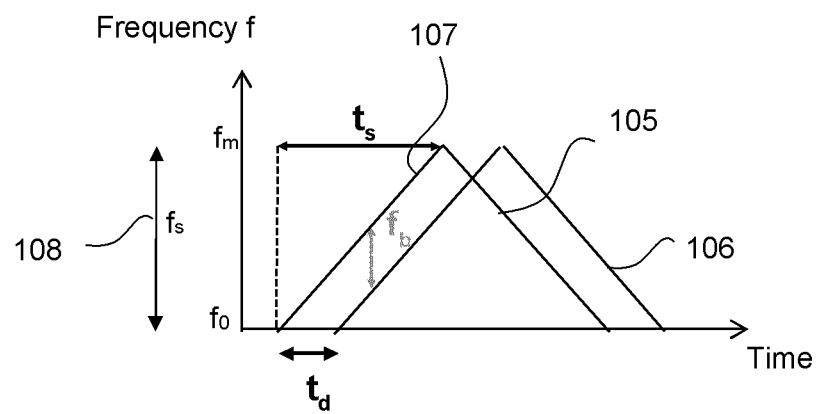
FIG. 12 shows a frequency ramp generated by a digital PLL circuit in accordance with an embodiment.

FIG. 12 illustrates a frequency versus time graph showing the frequency f of the transmitted signal 105 modulated in the form of a ramp 107 generated by the digital PLL 110 of the FMCW radar system 100. As illustrated further in FIG. 12, the received signal 106 has the same modulation as the transmitted signal 105 shifted by a time period td equal to the time of flight of the signal travelling back and forth the distance d (FIG. 11) between the object 104 (FIG. 11) and the radar system 100 (FIG. 11). The frequency of the ramp 107 varies within a specific frequency band or bandwidth 108 also called sweep frequency fs defining a frequency lower limit f0 and an frequency upper limit fm. For example, in an implementation of the present radar system the lower limit f0 may be 77 GHz and the bandwidth 4 GHz.

Advantageously, the digital PLL 110 according to the present application generates a linear ramp 107 which implies that the frequency difference fb between the transmitted signal 105 and the reflected signal 106, also called beat frequency, remains constant with time. It allows in turn a direct relationship between that beat frequency fb and the distance d, with c the speed of light and is the sweep time of the ramp 107 as represented by Equation 1:

$$d = c * t_s * \frac{f_b}{2 * f_s}.$$ (Equation 1)

It is easily conceived that nonlinearities in the frequency ramp result in error measurements of the beat frequency fb and lead to poor radar resolution. Due to the calibration algorithm described in the present application, the output digital PLL of the present teaching can sweep across the DCO tuning range without significant frequency discontinuities as bands are crossed, thereby providing a highly linear ramp and hence an accurate determination of the position of the object 103 and a high radar resolution.

It is however not intended to limit the present teaching to any one set of advantages or features as modifications can be made without departing from the spirit and or scope of the present teaching.

A digital PLL or PLL according to the present teaching can be implemented in various electronic devices. Examples of the electronic devices can include, but are not limited to, consumer electronic products, parts of the consumer electronic products, electronic systems for vehicles, electronic radar systems, electronic test equipment, wireless communications infrastructure, etc. as well as circuits of optical networks or other communication networks, and disk driver circuits.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

The teachings provided herein can be applied to other systems, not necessarily the circuits described above. The elements and acts of the various embodiments or aspects described above can be combined to provide further embodiments or aspects. The act of the methods discussed herein can be performed in any order as appropriate. Moreover, the acts of the methods discussed herein can be performed serially or in parallel, as appropriate.

While certain embodiments or aspects have been described, these embodiments or aspects have been presented by way of example only, and are not intended to limit the scope of the disclosure. Indeed, the novel methods and circuits described herein may be embodied in a variety of other forms. Furthermore, various omissions, substitutions and changes in the form of the methods and circuits described herein may be made without departing from the spirit of the disclosure. The accompanying claims and their equivalents are intended to cover such forms or modifications as would fall within the scope and spirit of the disclosure. Accordingly, the scope of the present invention is defined by reference to the claims.

What is claimed is:

1. A phase-locked loop (PLL) that is re-configurable for calibration, the PLL comprising:
   an input of the PLL configured to receive a frequency controlled word (FCW);
   a multi-band oscillator, a loop filter, and a memory configured to store a control input value for the multi-band oscillator;
   wherein the PLL is operable in a calibration mode to provide an output from the loop filter to the input of the PLL to thereby acquire a value for the FCW based on the output from the loop filter, and wherein an output of the multi-band oscillator is coupled to an input of the loop filter;
   wherein the PLL is operable to provide the output from the loop filter to the multi-band oscillator and to determine the control input value based on providing the value for the FCW to the input of the PLL; and
   wherein the PLL is configured to provide a control input threshold value to a fine control input of the multi-band oscillator in the calibration mode while the multi-band oscillator operates in a first band.

2. The PLL of claim 1, wherein the loop filter is configured to provide the output to the fine control input of said multi-band oscillator and to provide a second output to a coarse control input of the multi-band oscillator in a normal mode of operation of the PLL.

3. The PLL of claim 1, wherein the multi-band oscillator is configured to generate a frequency corresponding to the value for the FCW when the control input threshold value is provided to the fine control input in the calibration mode while the multi-band oscillator operates in the first band; and
   wherein the PLL is configured to change to the normal mode and identify the control input value that causes the multi-band oscillator to generate the frequency corresponding to the value for the FCW while operating the multi-band oscillator in a second band to generate the frequency corresponding to the value for the FCW, the second band being adjacent to the first band.

4. The PLL of claim 1, wherein prior to said acquiring of the value for the FCW, the PLL is further configured to set the fine control input of the multi- band oscillator to the control input threshold value.

5. The PLL of claim 1, wherein for each band of the multi-band oscillator, the PLL is further configured to store in said memory a respective control input value that, when provided to the multi-band oscillator, causes the multi-band oscillator to generate a respective value for the FCW on another adjacent band of the multi-band oscillator.

6. The PLL of claim 4, wherein the PLL is a digital PLL, and wherein the multi-band oscillator is a Digitally Controlled Oscillator (DCO) configured to receive a coarse digital control input and a fine digital control input, the control input threshold value being provided for the fine digital control input.

7. A frequency modulated continuous wave (FMCW) radar device comprising:
  a transceiver configured to transmit and receive a frequency ramp signal;
  a frequency ramp generator configured to produce the frequency ramp signal, the frequency ramp generator comprising a phase-locked loop (PLL) comprising:
    a multi-band oscillator,
    a loop filter,
    a memory configured to store a control input value for providing to a control input for the multi-band oscillator, and
    a phase accumulator comprising an input of the PLL configured to receive a frequency controlled word (FCW);
  wherein the PLL is operable in a calibration mode in which the PLL is configured to provide an output from the loop filter to an input of the PLL to thereby acquire a value for the FCW and wherein an output of the multi-band oscillator is coupled to an input of the loop filter; and
  wherein the PLL is operable to provide the output from the loop filter to the multi-band oscillator and to determine the control input value based on providing the value for the FCW to the input of the PLL.

8. The FMCW radar device of claim 7, wherein the loop filter is further configured to provide a second output to a coarse control input of the multi-band oscillator, and wherein the control input is a fine control input of the multi-band oscillator.

9. The FMCW radar device of claim 8, wherein the PLL is further configured to:
  generate a frequency corresponding to the value for the FCW when a control input threshold value is provided to the fine control input while the multi-band oscillator operates in a first coarse band while the PLL is in the calibration mode;
  determine the control input value based on providing the value for the FCW to the input of the PLL while the multi-band oscillator generates the frequency while operating in a second coarse band that is adjacent to the first coarse band while the PLL is in the normal mode; and
  store the control input value into the memory.

10. The FMCW radar device of claim 9, wherein the PLL is configured to perform the acquiring, the generating, the determining of the control input values, and the storing for each band of the multi-band oscillator successively.

11. The FMCW radar device of claim 7, wherein prior to said acquiring of the value for the FCW, the PLL is further configured to set the control input of the multi-band oscillator to have a control input threshold value.

12. The FMCW radar device of claim 7, wherein for each band of the multi-band oscillator, the PLL is configured to store in said memory a respective control input generating respective values for said FCW on a respective adjacent band of the multi-band oscillator.

13. The FMCW radar device of claim 7, wherein the PLL is a digital PLL, the multi-band oscillator is a Digitally Controlled Oscillator (DCO) configured to receive a coarse digital control input and a fine digital control input.

14. A vehicle comprising the frequency modulated continuous (FMCW) radar device of claim 7.

15. A frequency calibration method for calibrating a phase- locked loop (PLL) comprising a multi-band oscillator, the method comprising:
  coupling an output of a loop filter of the PLL to an input of the PLL in a calibration mode, wherein the input of the PLL is configured to receive a frequency controlled word (FCW) in a second mode;
  acquiring a value for the FCW based on an output of the loop filter while an output of the multi-band oscillator is coupled to an input of the loop filter and a first control input threshold value is provided on a first band of the multi-band oscillator;
  generating a frequency corresponding to the value for the FCW on a second band of the multi-band oscillator adjacent to said first band; and
  identifying and storing a second control input value for the second band that, when provided to the multi-band oscillator, causes the multi-band oscillator to generate said frequency corresponding to the value for the FCW.

16. The method of claim 15, wherein the frequency corresponding to the value for the FCW is generated on the second band of the multi-band oscillator while the output of the loop filter is coupled to an input of the multi-band oscillator.

17. The method of claim 15, further comprising prior to said acquiring of the value for the FCW, setting a fine control input of the multi-band oscillator to have said first control input threshold value.

18. The method of claim 15, wherein the acquiring, the generating, the identifying, and the storing are performed for each band of the multi-band oscillator.

19. The method of claim 15, further comprising, for each band of the multi-band oscillator: storing in a look-up table a further control input value that causes the multi-band oscillator to generate the value for the FCW on another adjacent band of the multi- band oscillator.

20. The method of claim 15, wherein the PLL is a digital PLL, the multi-band oscillator is a Digitally Controlled Oscillator (DCO) and the method comprises receiving a coarse digital control input and a fine digital control input.

21. The PLL of claim 1, wherein the PLL comprises a phase accumulator, and the input of PLL is an input of the phase accumulator.

22. The method of claim 15, wherein said coupling comprises coupling the output of the loop filter to an input of a phase accumulator of the PLL.

23. A phase-locked loop (PLL) that is re-configurable for calibration, the PLL comprising:
  an input of the PLL configured to receive a frequency controlled word (FCW);
  a multi-band oscillator, a loop filter, and a memory configured to store a control input value for the multi-band oscillator;
  wherein the PLL is operable in a calibration mode to provide an output from the loop filter to the input of the PLL to thereby acquire a value for the FCW based on the output from the loop filter, and wherein an output of the multi-band oscillator is coupled to an input of the loop filter;

wherein the PLL is operable to provide the output from the loop filter to the multi- band oscillator and to determine the control input value based on providing the value for the FCW to the input of the PLL; and wherein prior to said acquiring of the value for the FCW, the PLL is further configured to set a fine control input of the multi-band oscillator to a control input threshold value.

24. The PLL of claim 23, wherein the PLL is a digital PLL, and wherein the multi-band oscillator is a Digitally Controlled Oscillator (DCO) configured to receive a coarse digital control input and the fine control input.

25. The PLL of claim 1, wherein the PLL comprises a phase accumulator, and the input of PLL is an input of the phase accumulator.

26. The PLL of claim 23, wherein the PLL is configured to provide the control input threshold value to the fine control input of the multi-band oscillator in the calibration mode while the multi-band oscillator operates in a first band.

* * * * *

UNITED STATES PATENT AND TRADEMARK OFFICE
CERTIFICATE OF CORRECTION

PATENT NO. : 10,727,848 B2
APPLICATION NO. : 14/794661
DATED : July 28, 2020
INVENTOR(S) : Pablo Cruz Dato et al.

Page 1 of 1

It is certified that error appears in the above-identified patent and that said Letters Patent is hereby corrected as shown below:

In the Claims

Column 15, Line 1, Claim 4, delete "multi- band" and insert --multi-band--.

Column 16, Lines 10-11, Claim 14, delete "continuous" and insert --continuous wave--.

Column 16, Line 13, Claim 15, delete "phase- locked" and insert --phase-locked--.

Column 16, Line 47, Claim 19, delete "multi- band" and insert --multi-band--.

Column 17, Line 5, Claim 23, delete "multi- band" and insert --multi-band--.

Signed and Sealed this
Twenty-ninth Day of September, 2020

Andrei Iancu
*Director of the United States Patent and Trademark Office*